(12) United States Patent
Jokinen

(10) Patent No.: US 6,384,576 B1
(45) Date of Patent: *May 7, 2002

(54) CONDITION MONITORING SYSTEM FOR BATTERIES

(76) Inventor: Usko Jokinen, PL 1, FIN-00641, Helsinki (FI)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/441,913

(22) Filed: Nov. 17, 1999

(51) Int. Cl.[7] .................................................. H02J 7/00

(52) U.S. Cl. ......................................................... 320/122

(58) Field of Search ................................. 320/122, 121, 320/118, 132; 340/636

(56) References Cited

U.S. PATENT DOCUMENTS

| 4,204,153 | A | * | 5/1980 | Brown | 320/132 |
|---|---|---|---|---|---|
| 4,238,721 | A | * | 12/1980 | DeLuca et al. | 320/122 |
| 5,281,920 | A | * | 1/1994 | Wurst | 320/126 |
| 5,592,067 | A | * | 1/1997 | Peter et al. | 320/118 |
| 5,642,100 | A | * | 6/1997 | Farmer | 340/636 |
| 5,661,463 | A | * | 8/1997 | Letchak et al. | 340/636 |
| 5,742,150 | A | * | 4/1998 | Khuwatsamrit | 320/121 |
| 6,046,573 | A | * | 4/2000 | Wikstrom | 320/118 |

* cited by examiner

Primary Examiner—Peter S. Wong
Assistant Examiner—Pia Tibbits
(74) Attorney, Agent, or Firm—Kolisch Hartwell Dickinson McCormack & Heuser

(57) ABSTRACT

The invention relates to a control system of battery health. One or more cells of a float charged battery are shunted periodically through a current generator; or through a switch and a resistor. The system measures impedance and/or state of charge by sampling the change in cell voltage during a shunt period or between sequel shunt periods.

7 Claims, 1 Drawing Sheet

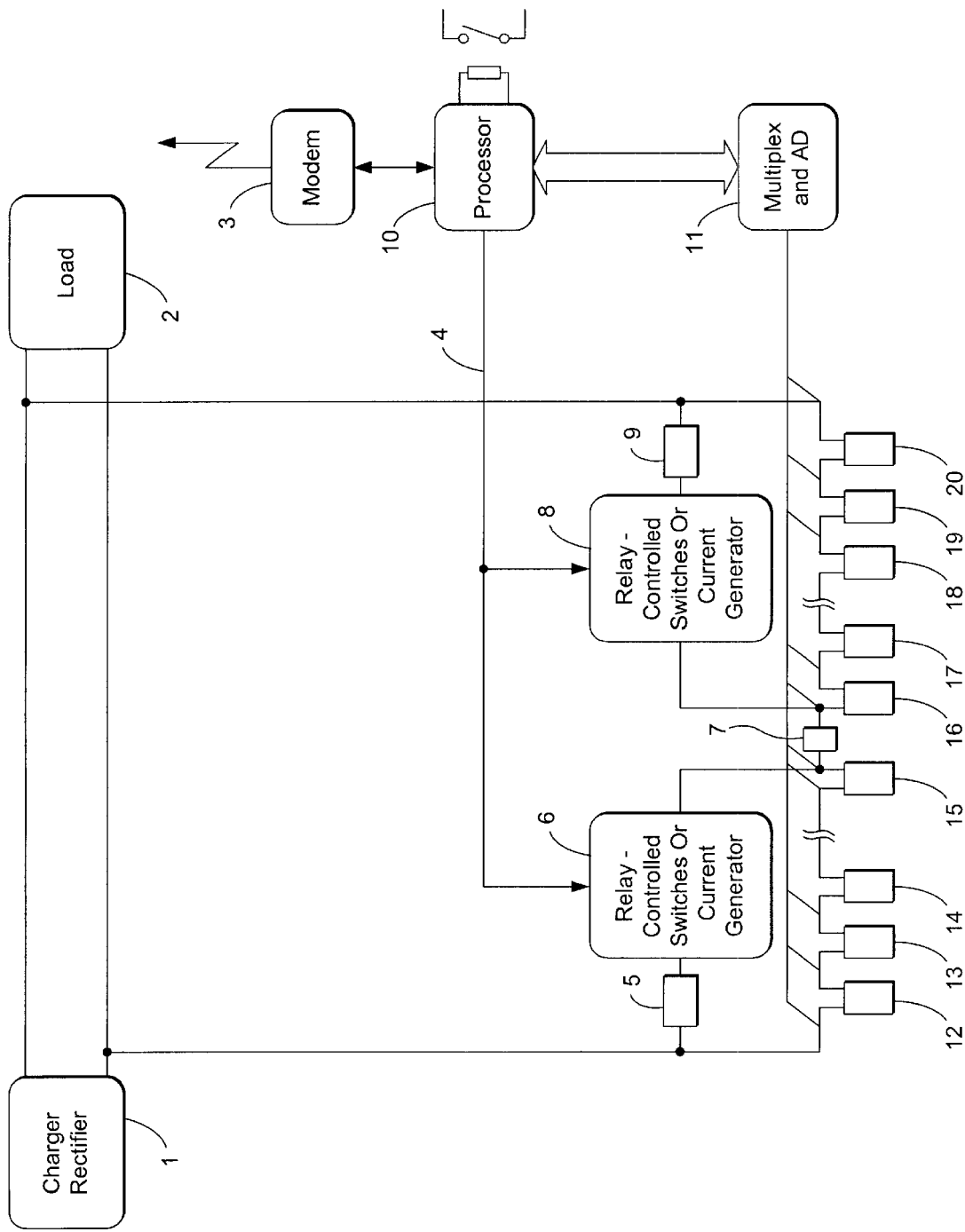

CONDITION MONITORING SYSTEM FOR BATTERIES

The invention relates to a control system of battery health, which is used to measure the impedance and/or state of charge of the cells of a battery.

Batteries are used to ensure the supply of energy in important systems when breakdown has occurred. The safety equipment of energy generation and distribution, computers, equipment used in telecommunication, traffic-related security equipment, critical equipment in hospitals and in the back-up systems of lighting kinds of systems.

The condition of batteries is ensured by regular maintenance. The normal method of maintenance carried out 2–4 times a year is measuring the cell voltages and specific gravities in float charging situations. A load test is performed once in 1–3 years. In addition, the connections and internal corrosion of a battery are normally measured by impedance and conductance measurements. The difficulty in using Valve Regulated Lead Acid Batteries (VRLA-) is the high variation of cell voltage. Another difficulty is related to the drying-up of a cell causing a voltage increase and is compensated by sulfatization causing a voltage decrease. Therefore, the voltage measurement does not necessarily tell anything of battery health. Measuring impedance and conductance are normally used as methods of maintenance, although the correlation between these two and the battery health is not 100 percent. In addition, a high deviation even in cells of the same series and a strong temperature coefficient make it difficult to interpret the readings. In VRLA-batteries also, so-called thermal runaway exists, which is caused by the negative coefficient between gas voltage and temperature is a big problem, especially when old and cheap chargers lacking temperature compensation are used.

The load tests carried out on a regular basis make sure the battery is healthy. By comparing the increased impedance the test interval may be lengthened. The measurement of impedance and conductance by using the normal 4-wire-system (separate wires for current and voltage) requires the removing of the covers. Getting a good connection simultaneously in both the current and the voltage probe is difficult. Oxygenated surface may give incorrect readings if the probe does not penetrate lead oxide surface.

The U.S. patent document 5,214,385 recognizes the system of battery health, in which the state of charge is measured by using a separate power supply. In this case the measurement effects the total battery voltage and load voltage. The system is not used to measure impedance. The system used in the present invention according to the following description does not need a separate power supply, whereby the measurement does not effect the total battery voltage nor the load voltage. In addition the system of the present invention enables the measurement of state of charge alone or together with impedance measurement.

When the cell is charged electrical energy is used in a chemical reaction, in which lead sulfate becomes lead oxide and lead. When the cell is fully charged energy is used break down water. The gas forming on the electrodes increases cell voltage which in return decreases the float current. The total voltage of a battery is adjusted to a level (Stationary lead batteries typically 2.23 volts per cell) on which even the worst cell remains fully charged. In practice this means a continuous overcharging that shortens the lifetime of the cells.

One of the targets of the invention is to create a system that can be used in the follow-up of the battery health, especially used in the measurement of the internal corrosion based on impedance measurement and/or the measurement cells' state of charge, which may be determined by measuring changes in cell voltage during shunt periods. Another target is to create a system that maintains the battery cells' state of charge using a charge voltage slightly lower than the one used normally. This prevents the overcharging of the cells, which lengthens the lifetime of the cells. Yet another target is a low-cost way to carry out the invention.

In the following an embodiment of the invention is described by referring to the enclosed drawing, which demonstrates the block diagram describing this invention.

The battery containing cells 12–20 is connected to charger 1 in float charge. Cells 12–15 can be shunted by current generator 6 and cells 16–20 can be shunted by current generator 8. When some of the cells in float charge are shunted their cell voltage decreases while the voltage of the other cells increases. The total voltage of the battery does not change. By measuring the changes in cell voltage resulting from the shunt's switch-on, the cell impedance is found out. By following the voltage change and by sampling during numerous shunt periods the cells' gas voltage and state of charge is found out.

Protection resistors 5 and 9 have been calculated to stand a short circuit of a full battery. The current's shunt resistor 7 is not necessary, but when used, one can lower the accuracy of the current generators. Instead of using current generators 6, 8, it is possible also to use relay-controlled switches, as indicated in blocks 6 and 8. The battery may be divided into more than two shunt blocks. On the other hand, the invention can be used as a single shunt block version.

The basic principle of the invention is shunting a single or multiple cell by current generators 6, 8 in which case the cell voltage change implies the state of charge. During each shunt period a number of samplings take place. The frequency of shunt periods may be for example 3 Hz.

The system based on this invention enables measurement of impedance and finding out the state of charge of a single cell or a whole block of cells, both field-operated and remote-controlled. In a fixed installation, the current generators 6, 8 can be used to give an equalization charge. The processor 10 performs sampling and signal processing to find out the state of charge according to the measurements and switches on the current generator or switch to shunt the cells that are not charged. In this manner, the battery can be held in just the right state of charge. If a continuous need to charge is detected, the processor gives an alarm through an alarm output 4. When a low charged cell is detected, one of the current generators 6, 8 can be left on for certain time (for example, 10 minutes) and measure the state of charge in repetition and repeat the cycle until the cell is fully charged. In this way, one avoids continuous overcharging.

The readings are transferred through multiplexer and AD-converter 11 to processor 10. The system can be connected to remote monitoring through modem 3 or the information may be downloaded to a data collector through the modem connector. The system saves the measurements and information of the additional charge. When the network breaks down one automatically saves the time, duration and the measurements (voltages, currents and temperatures, etc.).

The wiring may also be done, in which case current generators 6, 8, multiplexer/AD-converter 11 and processor 10 are in the data collector unit. In this way the float current, cell voltages, impedances and the state of the charge are collected in the data collection unit. In the most simple case a separate pair of current generators and data collection unit provided with probes may be used.

The voltage of charger 1 may be adjusted to a lower level, because all the cells may be kept fully charged by current generators 6, 8. This also enables the use of old chargers with VRLA-batteries, because thermal runaway caused by overcharging does not occur.

I claim:

1. A system for battery health, in which the battery's cells' impedance and state of charge is measured, the system including:

means for shunting one or more of the cells of the battery when the battery is in a floating state, characterized by the fact that, when the battery is in the floating state, a first portion of the cells of the battery is shunted through a current generator, or through a switch and resistor, for successive shunt periods, a second portion of the cells of the battery remaining unshunted, and by the fact that the system measures the state of charge by measuring increases in cell voltage of the second portion of the cells of the battery by sampling successive voltage readings of individual cells of the second portion of the cells of the battery during the successive shunt periods.

2. The system according to claim 1, characterized in that the batteries are held in the correct state of charge on the basis of sampling successive voltage readings by shunting one or more floating cells through the current generator or through the switch, the control of which is based on sampling successive voltage readings such as to cause one or more of the unshunted battery cells to get an equalization charge.

3. The system according to claim 2, characterized in that the system includes two or more current generators, or at least two switches which are connected between battery poles and a connection point between cells, making it able to shunt alternatively the separate cells of a battery by current generators or by switches.

4. The system according to claim 3, characterized in that the periods of sampling the state of charge and the periods of charge equalization follow each other at repeated cycles until any detected low charged cell is fully charged, or until a continuous need to charge is detected and an alarm is given.

5. The system according to claim 2, characterized in that the periods of sampling the state of charge and the periods of charge equalization follow each other at repeated cycles until any detected low charged cell is fully charged, or until a continuous need to charge is detected and an alarm is given.

6. The system according to claim 1, characterized in that the system includes two or more current generators, or at least two switches which are connected between battery poles and a connection between cells, making it able to shunt alternatively the separate cells of a battery by current generators or by switches.

7. The system according to claim 6, characterized in that the periods of sampling the state of charge and the periods of charge equalization follow each other at repeated cycles until any detected low charged cell is fully charged, or until a continuous need to charge is detected and an alarm is given.

* * * * *